US009631292B2

(12) United States Patent
Roeger-Goepfert et al.

(10) Patent No.: US 9,631,292 B2
(45) Date of Patent: Apr. 25, 2017

(54) COMPOSITION FOR METAL ELECTROPLATING COMPRISING AN ADDITIVE FOR BOTTOM-UP FILLING OF THOUGH SILICON VIAS AND INTERCONNECT FEATURES

(75) Inventors: Cornelia Roeger-Goepfert, Weinheim (DE); Marco Arnold, Heidelberg (DE); Alexander Fluegel, Bad Duerkheim (DE); Charlotte Emnet, Bad Duerkheim (DE); Roman Benedikt Raether, Speyer (DE); Dieter Mayer, Darmstadt (DE)

(73) Assignee: BASF SE, Ludwigshafen (DE)

( * ) Notice: Subject to any disclaimer, the term of this patent is extended or adjusted under 35 U.S.C. 154(b) by 297 days.

(21) Appl. No.: 14/123,129

(22) PCT Filed: May 31, 2012

(86) PCT No.: PCT/IB2012/052727
§ 371 (c)(1),
(2), (4) Date: Nov. 29, 2013

(87) PCT Pub. No.: WO2012/164509
PCT Pub. Date: Dec. 6, 2012

(65) Prior Publication Data
US 2014/0097092 A1 Apr. 10, 2014

Related U.S. Application Data

(60) Provisional application No. 61/491,935, filed on Jun. 1, 2011.

(51) Int. Cl.
*C25D 3/38* (2006.01)
*C23C 18/38* (2006.01)
*C25D 7/12* (2006.01)
*C08G 73/02* (2006.01)
*C08L 79/02* (2006.01)

(52) U.S. Cl.
CPC ............. *C25D 3/38* (2013.01); *C08G 73/028* (2013.01); *C08L 79/02* (2013.01); *C23C 18/38* (2013.01); *C25D 7/123* (2013.01)

(58) Field of Classification Search
CPC .. C25D 3/38; C25D 3/40; C25D 7/123; C23C 18/38; C08G 73/028; C08L 79/02
See application file for complete search history.

(56) References Cited

U.S. PATENT DOCUMENTS 4,315,087 A 2/1982 Redmore et al.
6,425,996 B1 7/2002 Dahms et al.
(Continued)

FOREIGN PATENT DOCUMENTS

CN 101878252 A 11/2010
EP 1 978 134 B1 9/2013
(Continued)

OTHER PUBLICATIONS

U.S. Appl. No. 14/438,688, filed Apr. 27, 2015, Kienle, et al.
(Continued)

*Primary Examiner* — Louis Rufo
(74) *Attorney, Agent, or Firm* — Oblon, McClelland, Maier & Neustadt, L.L.P.

(57) ABSTRACT

A composition comprising a source of metal ions and at least one polyaminoamide, said polyaminoamide comprising amide and amine functional groups in the polymeric backbone and aromatic moieties attached to or located within said polymeric backbone.

20 Claims, 4 Drawing Sheets

(56) References Cited

U.S. PATENT DOCUMENTS

| | | |
|---|---|---|
| 2004/0045832 A1 | 3/2004 | Martyak |
| 2007/0179270 A1 | 8/2007 | Mock-Knoblauch et al. |
| 2009/0035940 A1 | 2/2009 | Richardson et al. |
| 2009/0143520 A1 | 6/2009 | Elia et al. |
| 2010/0247774 A1 | 9/2010 | Elia et al. |
| 2011/0062029 A1 | 3/2011 | Isono et al. |
| 2012/0292193 A1 | 11/2012 | Roeger-Goepfert et al. |

FOREIGN PATENT DOCUMENTS

| | | | |
|---|---|---|---|
| JP | 2007-107074 A | | 4/2007 |
| JP | 2007107074 A | * | 4/2007 |
| WO | WO 03/014192 A1 | | 2/2003 |
| WO | WO 2010/115717 A1 | | 10/2010 |
| WO | WO 2010/115756 A1 | | 10/2010 |
| WO | WO 2010/115757 A | | 10/2010 |
| WO | WO 2010/115796 A1 | | 10/2010 |
| WO | WO 2011/012462 A2 | | 2/2011 |
| WO | WO 2011/012475 A1 | | 2/2011 |
| WO | WO 2011/064154 A2 | | 6/2011 |
| WO | WO 2011/064154 A3 | | 6/2011 |

OTHER PUBLICATIONS

Extended European Search Report issued Nov. 3, 2011 in Patent Application No. 11168500.4.
International Search Report and Written Opinion issued Oct. 18, 2012 in PCT/IB2012/052727.

* cited by examiner

COMPOSITION FOR METAL ELECTROPLATING COMPRISING AN ADDITIVE FOR BOTTOM-UP FILLING OF THOUGH SILICON VIAS AND INTERCONNECT FEATURES

CROSS REFERENCE TO RELATED APPLICATIONS

The present application is a 35 U.S.C. §371 national stage patent application of International patent application PCT/IB2012/052727, filed on May 31, 2012, published as WO/2012/164509 on Dec. 6, 2012, the text of which is incorporated by reference, and claims the benefit of the filing date of U.S. provisional application No. 61/491,935, filed on Jun. 1, 2011, the text of which is also incorporated by reference.

The invention relates to a composition for metal electroplating for bottom-up filling of features on electronic substrates, in particular those having micrometer dimensions and high aspect ratios.

BACKGROUND OF THE INVENTION

Filling of features, such as vias and trenches, by copper electroplating is an essential part of the semiconductor manufacture process. It is well known, that the presence of organic substances as additives in the electroplating bath can be crucial in achieving a uniform metal deposit on a substrate surface and in avoiding defects, such as voids and seams, within the vias.

US 2004/0045832 A1 discloses methanesulfonate based compositions for copper electroplating of vias and trenches having diameters of 1 to 500 micrometers and high aspect ratios like vias or microvias. The additives used are high molecular weight polyether-type suppressors, sulfur-atoms containing accelerators (brighteners) like bissulfopropyl disulfide (SPS, 3,3'-dithiobis(1-propanesulfonic acid)), and levelers like alkylated polyalkyleneimines or hydroxyethyl imidazolidinethione.

US 2009/0035940 A1 discloses the use of polarizeres and depolarizers as additives for rapid and defect-free copper electroplating of large-size TSV features. A typical and preferred depolarizer is SPS. A typical and preferred polarizer is methyl quaternized polyvinylpyridine.

U.S. Pat. No. 6,425,996 B1 discloses leveling agents comprising the reaction product of polyaminoamides and epihalohydrins, dihalohydrins and 1-halogen-2,3-propanediols, respectively. Phthalic or terephatlic acid are mentioned as potential educts to prepare the polyaminoamide intermediates.

EP 1978134 A1 discloses leveling agents comprising polyethoxylated polyamides or polyethoxylated polyaminoamides.

US 2011/062029 discloses a copper electroplating polyaminoamide additive being prepared by modifying a polycondensation product composed of diethylene triamine, adipic acid and ε-caprolactam with epichlorhydrin.

WO 2011/064154 discloses the use of polyaminoamides in copper electoplating baths.

Feature dimensions in 3DTSV applications are relatively large (micrometer size) and therefore feature geometry does not have as much impact on the copper grain size at plating as it has in advanced dual damascene application (nanometer size). In large features copper grain size as plated is mainly influenced by the plating chemistry that was used for the copper deposition. When applying a plating chemistry that results in small copper grains a strong recrystallization process to form large copper grains might occur in the following anneal process. Strong recrystallization during annealing induces stress on the substrate which can cause damage. Stress evolution can be minimized or avoided when large copper grains already form in the features during the copper deposition.

It is an object of the present invention to provide a copper electroplating bath providing rapid deposition of copper into micrometer or nanometer scale features without forming defects, such as but not limited to voids.

It is a further object of the present invention to provide copper deposits into micrometer scale features having an increased grain size and thus leading to reduced stress during annealing.

Without the intention to be bound to any particular theory it is believed that the grains size is strongly related to the amount of impurities in the deposited copper layer. It is therefore a further object of the present invention to provide copper deposits into micrometer scale features having reduced impurity content.

It is a further aspect of the present invention to provide a copper electroplating additive having good superfilling properties, in particular suppressing agents capable of providing a substantially voidless and seamless filling of features on the nanometer and on the micrometer scale with a metal electroplating bath, preferably a copper electroplating bath. It is a further object of the present invention to provide a copper electroplating additive capable of providing a substantially voidless and seamless filling of features having a convex shape.

SUMMARY OF THE INVENTION

It has been surprisingly discovered that aromatic polyaminoamides can be used as additives in copper electroplating baths for micrometer-sized feature filling, in particular TSV filling.

The present invention provides a composition comprising a source of metal ions, and at least one polyaminoamide comprising at least one aromatic moiety as described herein, and optionally an accelerating agent and/or a suppressing agent.

A further aspect of the present invention is the use of at least one polyaminoamide in a bath for depositing metal containing layers on substrates comprising features having a diameter of 1 to 500 micrometer and an aspect ratio of 4 or more, in particular through silicon vias.

A further aspect of the present invention is a process for depositing a metal layer on a semiconductor substrate comprising features having a diameter of 1 to 500 micrometer and an aspect ratio of 4 or more, in particular through silicon vias, by a) contacting a metal plating bath comprising a metal electroplating composition as described herein with the semiconductor substrate, and
b) applying a current density to the substrate for a time sufficient to deposit a metal layer onto the substrate.

The present invention provides a plated metal layer, particularly a plated copper layer, on a substrate containing features on the micrometer scale or on the nanometer scale wherein the metal layer has reduced overplating and all features are substantially free of added voids, and preferably substantially free of voids.

A further advantage of the additives according to the present invention is the decreased impurity content and the increased grain size of the deposited copper layer in contrast to other aromatic polymer additives like polyvinylpyridine.

DETAILED DESCRIPTION OF THE INVENTION

As used herein, "polymer" or "polymeric compound" generally means any compound comprising (in average) at least two monomeric units i.e. the term polymer includes dimers, trimers, etc., oligomers as well as high molecular weight polymers. Preferably, a polymeric compound comprises (in average) at least 4 monomeric units, more preferably at least 6 monomeric units, most preferably at least 10 monomeric units.

It is essential for the present invention that the polyaminoamide additives comprise aromatic moieties. As used herein, "aromatic" means any compound comprising unsaturated organic molecules having conjugated pi electrons and which fulfills the 4n+2 Hückel rule of aromaticity. Aromatic moieties may be carbocyclic or heterocyclic aromatic moieties. Such aromatic moieties may further comprise non-aromatic parts, such as, but not limited to, alkyl groups.

Examples for aromatic polyaminoamides are either polyaminoamides comprising one or more aromatic moieties located in the polymer backbone or polyaminoamides functionalized by functional groups comprising one or more aromatic moieties attached to the polymeric backbone, i.e. in the side chains. If the aromatic moieties are located in the polymer backbone, the aromatic moieties are preferably located between two nitrogen atoms.

As used herein, "polymer backbone" means the longest continuous chain of the polymer, whereas "side chains" mean any other chains.

As used herein, "feature" refers to the geometries on a substrate, such as, but not limited to, trenches and vias. "Apertures" refer to recessed features, such as vias and trenches. As used herein, the term "plating" refers to metal electroplating, unless the context clearly indicates otherwise. "Deposition" and "plating" are used interchangeably throughout this specification. The term "alkyl" means C1 to C20 alkyl and includes linear, branched and cyclic alkyl. "Substituted alkyl" means that one or more of the hydrogens on the alkyl group is replaced with another substituent group, such as, but not limited to, cyano, hydroxy, halo, (C1-C6)alkoxy, $(C_1-C_6)$alkylthio, thiol, nitro, and the like.

As used herein "aryl" mean carbocyclic aromatic systems, such as, but not limited to, phenyl, naphthyl and the like. As used herein, "heteroaryl" means heterocyclic aromatic systems, such as, but not limited to pyridyl and the like. By "substituted aryl" or "substituted heteroaryl" is meant that one or more hydrogens on the aryl ring are replaced with one or more substituent groups, such as, but not limited to, cyano, hydroxy, halo, $(C_1-C_6)$alkoxy, $(C_1-C_6)$alkyl, $(C_2-C_6)$ alkenyl, $(C_1-C_6)$alkylthio, thiol, nitro, and the like. As used herein "alkaryl" means alkyl substituted carbocyclic aromatic systems, such as, but not limited to, benzyl, naphthylmethyl, xylyl, and the like. As used herein "alkheteroaryl" means alkyl substituted heterocyclic aromatic systems, such as, but not limited to, methylpyridyl and the like.

As used herein, "alkanediyl" refers to a diradical of linear or branched, straight chain or cyclic alkanes. As used herein, "arylalkanediyl" refers to diradical of branched, straight chain or cyclic alkanes further comprising an at least one aryl moiety. The at least one aryl moiety may be located at the end of the alkane chain or interrupting the alkane chain, the latter being preferred.

As used herein, "accelerator" refers to an organic additive that increases the plating rate of the electroplating bath. The terms "accelerator" and "accelerating agent" are used interchangeably throughout this specification. In literature, sometimes the accelerator component is also named "brightener", "brightening agent", or "depolarizer".

As used herein, "inhibitor" and "polyaminoamide" are used synonymously since the additive decreases the plating rate of the electroplating bath. In the prior art many of the inhibitors are also called "levelers" or "leveling agents" since in nanometer-sized features most of these compounds show a so called leveling effect. A further class of inhibitors are so called "suppressors" or "suppressing agents", sometimes also called "wetting agents" or "surfactants". Inhibitors are sometimes also referred to as polarizers.

As used herein, "plating selectivity" means after plating, the copper deposition height ratio the via bottom compared to copper growth on wafer surface close to the vias.

"Overplating" refers to a thicker metal deposit over the feature as compared to areas free of features. Insofar the additives according to the present inventions act as "leveler". As used herein, "deposition rate" means the height of the copper deposit formed in the via bottom per minute.

As used herein, "aspect ratio" means the ratio of the depth of the feature to the opening diameter of the feature.

In a preferred embodiment of the present invention the polyaminoamide inhibitor comprises at least one structural unit of formula I or derivatives thereof obtainable by complete or partial protonation, N-functionalization, or N-quaternization. wherein A is a diradical selected from B is a chemical bond or a diradical selected from D is a chemical bond or a divalent group selected from $D^1$ is, for each repeating unit 1 to p independently, selected from a chemical bond or a divalent group selected from a saturated, unsaturated or aromatic $C_1$ to $C_{20}$ organic radicals, $D^2$, $D^3$ are independently selected from straight chain or branched $C_1$ to $C_{10}$ alkanediyl, which may optionally be substituted by heteroatoms selected from N and O.

$D^4$ is selected from straight chain or branched $C_2$ to $C_6$ alkanediyl, a $C_6$ to $C_{10}$ aryl or heteroaryl diradical, $C_8$ to $C_{20}$ arylalkanediyl, $C_8$ to $C_{20}$ heteroarylalkanediyl $D^5$ is selected from straight chain or branched $C_1$- to $C_7$-alkanediyl, which may optionally be substituted by heteroatoms.

$R^1$ is, for each repeating unit 1 to n independently, selected from H, $C_1$-$C_{20}$-alkyl and $C_5$-$C_{20}$-aryl or $C_5$-$C_{20}$-heteroaryl, which may optionally be substituted by hydroxyl, alkoxy or alkoxycarbonyl, n is an integer from 2 to 250,

P is an integer from 2 to 150, q is an integer from 0 to 150, r is an integer from 0 to 150, and wherein either at least one of $D^1$, $D^4$ or $R^1$ comprises a $C_5$ to $C_{20}$ aromatic moiety or the polyaminoamide is functionalized and/or quaternized with a $C_5$-$C_{20}$ aromatic moiety.

In particular polyaminoamides of formula II are can be used.

(II)

wherein $D^1$, $D^2$, $D^3$, $R^1$, n and p have the prescribed meanings, and $E^1$, $E^2$ are independently selected from
  (a) a nucleophilically displaceable leaving group,
  (b) NH—($C_1$-$C_{20}$-alkyl) or NH—($C_1$-$C_{20}$-alkenyl) or NH-aryl,
  (c) H—{NH-[$D^2$-N$R^1$]$_n$-$D^3$-NH}
  (d) ($C_1$-$C_{20}$-alkyl)-CO—{NH-[$D^2$-N$R^2$]$_n$-$D^3$-NH}, and
  (e) ($C_1$-$C_{20}$-alkenyl)-CO—{NH-[$D^2$-N$R^2$]$_n$-$D^3$-NH},
  (f) ($C_1$-$C_{20}$-aryl)-CO—{NH-[$D^2$-N$R^2$]$_n$-$D^3$-NH},
and wherein at least one of $D^1$ or $R^1$ comprises a $C_5$ to $C_{20}$ aromatic moiety.

Typically, the divalent organic radicals are straight chain or branched $C_1$ to $C_{20}$ alkanediyl, a $C_5$ to $C_{20}$ aryl diradical or $C_6$ to $C_{20}$ arylalkanediyl, which may optionally be interrupted or substituted by one or more heteroatoms.

In a preferred embodiment, $D^1$ is, for each repeating unit 1 to p independently, selected from a chemical bond or a $C_1$-$C_{20}$-alkanediylgroup, which may optionally be interrupted by amine or ether groups. More preferably $D^1$ is, for each repeating unit 1 to p independently, selected from a chemical bond or a linear $C_1$-$C_6$-alkanediyl group, more preferably from a linear $C_3$-, $C_4$-, and $C_5$-alkanediyl, most preferably from a linear butanediyl or an ethanediyl group.

In another preferred embodiment, $D^1$ is a saturated, unsaturated or aromatic 5- to 10-membered ring. More preferably $D^1$ is, for each repeating unit 1 to p independently, a $C_5$ to $C_{10}$ aryl or heteroaryl diradical. Most preferably selected from phenyl or pyridyl diradicals.

Preferably, $D^2$ is selected from straight chain or branched $C_1$ to $C_6$ alkanediyl, more preferably from $(CH_2)_m$, wherein m is an integer from 2 to 6, preferably 2 or 3, most preferably 2. Most preferably $D^2$ is selected from $(CH_2)_2$ or $(CH_2)_3$. Alternatively D2 may be an aromatic 5- to 10-membered ring system.

Preferably, $D^3$ is selected from straight chain or branched $C_1$ to $C_6$ alkanediyl, more preferably from $(CH_2)_m$, wherein m is an integer from 2 to 6, preferably 2 or 3, most preferably 2. Most preferably $D^3$ is selected from $(CH_2)_2$ or $(CH_2)_3$.

In a particular preferred embodiment $D^2$ and $D^3$ are identical and selected from $(CH_2)_2$ or $(CH_2)_3$. Preferably, $D^4$ is selected from xylylendiyl or from $(CH_2)_m$, wherein m is an integer from 2 to 6, preferably 2 or 3, most preferably 2.

Preferably, $D^5$ is selected from $(CH_2)_m$, wherein m is an integer from 4 to 6, most preferably m is 5.

Such alkanediyl diradicals $D^1$, $D^2$, $D^3$, $D^4$ and $D^5$ may be interrupted by O or N atoms, preferably, O atoms to form diradicals comprising one or more ether groups. Preferred nonlimiting examples of such diradicals are $(CH_2)_2$—O—$(CH_2)_2$ or $(CH_2)_2$—O—$(CH_2)_2$—O—$(CH_2)_2$.

In a preferred embodiment the polyaminoamide is unsubstituted and therefore $R^1$ is hydrogen.

In another preferred embodiment the polyaminoamide is N-substituted and $R^1$ is, for each repeating unit 1 to n independently, selected from $C_1$-$C_{10}$-alkyl or $C_1$-$C_{10}$-alkenyl, which may optionally be substituted by hydroxyl, alkoxy or alkoxycarbonyl. More preferably $R^1$ is selected from hydrogen or $C_1$-$C_3$ alkyl. Most preferably $R^1$ is methyl.

In another preferred embodiment the polyaminoamide is N-substituted and $R^1$ is, for each repeating unit 1 to n independently, selected from $C_5$-$C_{20}$-aryl or $C_5$-$C_{20}$-heteroaryl, which may optionally be substituted by hydroxyl, alkoxy or alkoxycarbonyl.

Preferably, n is an integer from 1 to 100, more preferably 1 to 10, more preferably 1 to 5, most preferably 1 or 2.

Preferably p is an integer from 2 to 100, more preferably from 2 to 80, most preferably from 5 to 70. p corresponds to the degree of polymerization. In average non-integer numbers are possible.

Preferably q is an integer from 0 to 100, more preferably from 0 to 20, most preferably 0.

Preferably r is an integer from 0 to 100, more preferably from 0 to 20, most preferably 0.

If the polyamidoamine according to formula (I) or (II) is not functionalized by any further aromatic functionalization reagent, at least one of the groups $D^1$ and $D^4$ is selected from aryl heteroaryl or alkaryl or alkheteroaryl.

Generally, the nucleophilically displaceable leaving group may be any functional group being nucleophilically displaceable. Preferred nucleophilically displaceable leaving group are selected from OH, alkoxy, and halogen, most preferably from OH, $OCH_3$, $OCH_2CH_3$, and Cl.

In a first preferred embodiment of the present invention q and r are both 0 and the at least one polyaminoamide is obtainable by reacting at least one polyalkylenepolyamine with at least one dicarboxylic acid. In particular, the at least one polyalkylenepolyamine is selected from the group of diethylenetriamine, triethylenetetramine, tetraethylenpentamine, pentaethylenehexamine, diaminopropylethylenediamine, ethylenepropylenetriamine, 3-(2-aminoethyl)aminopropylamine, dipropylenetriamine, polyethyleneimines, and mixtures thereof. In particular, the at least one dicarboxylic acid is selected from the group of oxalic acid (ethanedioic acid), malonic acid (propanedioic acid), succinic acid (butanedioic acid), tartaric acid (2,3-dihydroxybutanedioic acid), maleic acid ((Z)-butenedioic acid), itaconic acid (2-methylidenebutanedioic acid), glutaric acid (pentanedioic acid), adipic acid (hexanedioic acid), suberic acid (octanedioic acid), sebacic acid (decanedioic acid), iminodiacetic acid, aspartic acid (2-aminobutanedioic acid), glutamic acid, and mixtures thereof.

In a further preferred embodiment of the present invention q is 0 and the at least one polyaminoamide is obtainable by reacting at least one polyalkylenepolyamine with at least one dicarboxylic acid and at least one lactam, amino acid or peptide. In particular, the at least one lactam is ε-caprolactam.

In yet another preferred embodiment of the present invention r is 0 and the at least one polyaminoamide is obtainable by reacting at least one polyalkylenepolyamine with at least one dicarboxylic acid and at least one alkyl- or alkaryldiamine. In particular, the one alkyl- or alkaryldiamine are ethylendiamine or xylylendiamine.

In a further preferred embodiment the at least one polyaminoamide is obtainable by reacting at least one polyalkylenepolyamine with at least one dicarboxylic acid, at least one alkyl- or alkaryldiamine and at least one lactam, amino acid or peptide.

In a further preferred embodiment the polyaminoamide of formula (I) is functionalized. Such functionalization may be performed with aromatic or non-aromatic groups.

Functionalized polyaminoamides can be synthesized from polyaminoamides in a further reaction step. An additional functionalization can serve to modify the properties of the polyaminoamides. To this end, the primary, secondary and tertiary amino groups present in the polyaminoamides are converted by means of suitable agents which are capable of reaction with amino groups. This forms functionalized polyaminoamides.

The primary, secondary and tertiary amino groups present in the polyaminoamide can be protonated or alkylated and/or quaternized by means of suitable protonating or alkylating agents. Examples for suitable alkylating agents are organic compounds which contain active halogen atoms, such as the aralkyl halides, the alkyl, alkenyl and alkynyl halides, and the like. Additionally, compounds such as the alkyl sulphates, alkyl sultones, epoxides, alkyl sulphites, dialkyl carbonates, methyl formiate and the like may also be used. Examples of corresponding alkylating agents comprise benzyl chloride, chlormethyl naphthalene, chlormethyl pyridine, styrene oxide, ethylene oxide, propylene oxide, butylene oxide, propane sultone, dimethyl sulphate, dimethyl sulphite, dimethyl carbonate, (3-chloro-2-hydroxypropyl) trimethylammonium chloride, or the like. Preference is given to using aromatic alkylating agents like benzyl chloride, chlormethyl naphthalene, and styrene oxide.

Functionalized polyaminoamides can also be synthesized from polyaminoamides in two or more further reaction steps by applying a sequence of different protonating or alkylating agents. For example, the primary, secondary and tertiary amino groups present in the polyaminoamides are first reacted with an epoxide and in a second reaction step reacted with benzyl chloride.

According to a second embodiment of the present invention provides a polyaminoamide of formula III or derivatives of a polyaminoamide of formula III obtainable by complete or partial protonation, N-functionalization, or N-quaternization,
wherein
$D^6$ is, for each repeating unit 1 to s independently, a divalent group selected from a saturated, unsaturated or aromatic $C_1$-$C_{20}$ organic radical,
$D^7$ is selected from straight chain or branched $C_2$-$C_6$ alkanediyl, $C_6$-$C_{10}$ aryldiradical, $C_8$-$C_{20}$ arylalkanediyl,
$R^2$ is, for each repeating unit 1 to s independently, selected from H, $C_1$-$C_{20}$ alkyl, $C_1$-$C_{20}$ alkenyl, which may optionally be substituted by hydroxyl, alkoxy or alkoxycarbonyl, or aryl, and wherein two $R^2$ may together form a ring system, and
s is an integer from 1 to 250,
and wherein either at least one of $D^6$, $D^7$ or $R^2$ comprises a $C_5$-$C_{20}$ aromatic moiety or the polyaminoamide is functionalized and/or quaternized with a $C_5$-$C_{20}$ aromatic moiety.

Particularly preferred polyaminoamides are those according to formula IV wherein $D^6$, $D^7$, $R^3$, and s have the prescribed meanings and $E^3$, $E^4$ are independently selected from
(a) NH—$C_1$-$C_{20}$-alkyl or NH—$C_1$-$C_{20}$-alkenyl or NH-aryl,
(b) N—($C_1$-$C_{20}$-alkyl)$_2$ or N—($C_1$-$C_{20}$-alkenyl)$_2$ or N-(aryl)$_2$ or N—($C_1$-$C_{20}$-alkyl)($C_1$-$C_{20}$-alkenyl) or N—($C_1$-$C_{20}$-alkyl)(aryl) or N—($C_1$-$C_{20}$-alkenyl)(aryl),
(c) $NR^2$-$D^7$-$NR^2H$, or
(d) $NR^2$-$D^7$-$NR^2$—$CH_2$—$CH_2$—CO—NH—($C_1$-$C_{20}$-alkyl) or $NR^2$-$D^7$-$NR^2$—$CH_2$—$CH_2$—CO—NH—($C_1$-$C_{20}$-alkenyl) or $NR^2$-$D^7$-$NR^2$—$CH_2$—$CH_2$—CO—NH-aryl,
and wherein at least one of $D^6$ or $R^2$ comprises a $C_5$ to $C_{20}$ aromatic moiety.

Such polyaminoamides are also particularly useful for filling nanometer sized features, in particular filling features having openings of 50 nm or below, particularly 30 nm or below, most particularly 20 nm or below, and aspect ratios of 4 or more.

Preferably, $D^6$ is, for each repeating unit 1 to s independently, selected from ($CH_2$)$_g$, wherein g is an integer from 1 to 6, most preferably 1.

Preferably, $D^7$ is selected from straight chain $C_2$- to $C_6$-alkanediyl, most preferably from $C_2$-$C_3$ alkanediyl, or from $C_8$- to $C_{20}$-arylalkanediyl, most preferably xylylendiyl.

Preferably, $R^2$ is, for each repeating unit 1 to s independently, selected from H, $C_1$-$C_{20}$-alkyl, $C_1$-$C_{20}$-alkenyl, which may optionally be substituted by hydroxyl, alkoxy or alkoxycarbonyl, or aryl. In a first preferred embodiment the polyaminoamide is unsubstituted and therefore $R^2$ is hydrogen. In a second preferred embodiment the polyaminoamide is N-substituted and $R^2$ is, for each repeating unit 1 to s independently, selected from aryl, $C_1$-$C_{10}$-alkyl or $C_1$-$C_{10}$-alkenyl which may optionally be substituted by hydroxyl, alkoxy or alkoxycarbonyl. More preferably $R^2$ is selected from $C_1$-$C_3$ alkyl. Generally, two $R^2$ may also together form a ring system.

Preferably, $E^3$ and $E^4$ are independently selected from $NR^2$-$D^7$-$NR^2H$.

Preferably, s is an integer from 1 to 150, more preferably from 1 to 100, most preferably from 1 to 50.

If the polyamidoamine according to formula (II) is not functionalized by any further aromatic functionalization reagent in order to introduce aromatic moieties in the side chains, at least one of the groups $D^6$, $D^7$ and $R^2$ is selected from aryl, heteroaryl, alkaryl, or alkheteroaryl.

In a preferred embodiment the polyaminoamides III or IV are obtainable by reacting at least one diamine with at least one N,N'-bisacrylamide. Preferably the at least one diamine comprises two secondary amino groups or one secondary and one primary amino group. In particular, the at least one diamine is selected from the group of N,N'-dimethyl-1,2-diaminoethane, N,N'-dimethyl-1,3-diaminopropane, N,N'-dimethyl-1,4-diaminobutane, N—N'-diethyl-1,2-diaminoethane, N,N'-diethyl-1,3-diaminopropane, N,N'-diethyl-1,4-diaminobutane, piperazine, 2-(methylamino)ethylamine, 3-(methylamino)propylamine, 2-aminoethylpiperazine, N-(2-aminoethyl)ethanolamine, ethylene diamine, hexamethylene diamine, and etheramines like $H_2N$—$(CH_2)_2$—$O$—$(CH_2)_2$—$NH_2$ or $H_2N$—$(CH_2)_2$—$O$—$(CH_2)_2$—$O$—$(CH_2)_2$—$NH_2$. Besides the non-aromatic diamines, aromatic diamines, such as but not limited to, 4,4'-methylenedianiline, phenylendiamine, xylylendiamine, and mixtures thereof, may be used. In particular, the at least one bisacrylamide is selected from the group of N,N'-methylenebisacrylamide, N,N'-ethylenebisacrylamide, 1,6-hexamethylenebisacrylamide, N,N'-octamethylenebisacrylamide, xylenebisacrylamide, and mixtures thereof.

In a further preferred embodiment the polyaminoamides III or IV are obtainable by reacting at least one diamine with at least one N,N'-bisacrylamide at least one primary amine such as $H_2N$—(C—$C_{20}$-alkyl), $H_2N$—($C_1$-$C_{20}$-alkenyl) or $H_2NH$-aryl and/or with at least one secondary amine such as $HN(C_1$-$C_{20}$-alkyl$)_2$, $HN(C_1$-$C_{20}$-alkenyl$)_2$, $HN(aryl)_2$, $HN(C_1$-$C_{20}$-alkyl)($C_1$-$C_{20}$-alkenyl), $HN(C_1$—C-alkyl)(aryl) or $HN(C_1$-$C_{20}$-alkenyl)(aryl).

In a third preferred embodiment the polyaminoamides III or VI are obtainable by reacting at least one diamine with at least one N,N'-bisacrylamide at least one monoacrylamide compound such as $H_2C$=$CH$—$CO$—$NH$—($C_1$-$C_{20}$-alkyl), $H_2C$=$CH$—$CO$—$NH$—($C_1$-$C_{20}$-alkenyl) or $H_2C$=$CH$—$CO$—$NH$-aryl.

In a fourth preferred embodiment the polyaminoamides of formulae III or IV are functionalized.

Functionalized polyaminoamides III or IV can be synthesized from polyaminoamides III or IV, respectively, in a further reaction step. An additional functionalization can serve to modify the properties of the polyaminoamides III or VI. To this end, the primary, secondary and tertiary amino groups present in the polyaminoamides III or VI are converted by means of suitable agents which are capable of reaction with amino groups. This forms functionalized polyaminoamides III or VI.

The primary, secondary and tertiary amino groups present in the polyaminoamide II can be protonated or alkylated and/or quaternized by means of suitable protonating or alkylating agents. Examples for suitable alkylating agents are organic compounds which contain active halogen atoms, such as the aralkyl halides, the alkyl, alkenyl and alkynyl halides, and the like. Additionally, compounds such as the alkyl sulphates, alkyl sultones, epoxides, alkyl sulphites, dialkyl carbonates, methyl formiate and the like may also be used. Examples of corresponding alkylating agents comprise benzyl chloride, chlormethyl naphthalene, chlormethyl pyridine, styrene oxide, ethylene oxide, propylene oxide, butylene oxide, propane sultone, dimethyl sulphate, dimethyl sulphite, dimethyl carbonate, (3-chloro-2-hydroxypropyl) trimethylammonium chloride, or the like. Preference is given to using aromatic alkylating agents like benzyl chloride, chlormethyl naphthalene, and styrene oxide.

Functionalized polyaminoamides III or IV can also be synthesized from polyaminoamides III or IV in two or more further reaction steps by applying a sequence of different protonating or alkylating agents. For example, the primary, secondary and tertiary amino groups present in the polyaminoamides III or VI are first reacted with an epoxide and in a second reaction step reacted with benzyl chloride.

Besides the synthesis routs described above the polyaminoamides according to the present invention may also prepared by any other known methods, e.g. by the methods described in WO 03/014192.

A large variety of additives may typically be used in the bath to provide desired surface finishes for the Cu plated metal. Usually more than one additive is used with each additive forming a desired function. Advantageously, the electroplating baths may contain one or more of accelerators, inhibitors, suppressors, sources of halide ions, grain refiners and mixtures thereof. Most preferably the electroplating bath contains at least both, an accelerator and the inhibitor according to the present invention, and optionally a suppressor. Other additives may also be suitably used in the present electroplating baths.

Any accelerator agent may be advantageously used in the present invention. Accelerators useful in the present invention include, but are not limited to, compounds comprising one or more sulphur atom and a sulfonic/phosphonic acid or their salts.

The generally preferred accelerators have the general structure $M^4O_3X^4$—$R^{41}$—$(S)_d$—$R^{42}$, with:

$M^4$ is a hydrogen or an alkali metal (preferably Na or K),

$X^4$ is P or S, d=1 to 6, preferably 2,

$R^{41}$ is selected from C1-C8 alkyl group or heteroalkyl group, an aryl group or a heteroaromatic group. Heteroalkyl groups will have one or more heteroatom (N, S, O) and 1-12 carbons. Carbocyclic aryl groups are typical aryl groups, such as phenyl, naphtyl. Heteroaromatic groups are also suitable aryl groups and contain one or more N, O or S atom and 1-3 separate or fused rings, $R^{42}$ is selected from H or (—S—$R^{41'}XO_3M$), with $R^{41'}$ being identical to or different from $R^{41}$.

More specifically, useful accelerators include those of the following formulae:

$X^4O_3S$—$R^{41}$—$SH$ $X^4O_3S$—$R^{41}$—$S$—$S$—$R^{41'}$—$SO_3X^4$ $X^4O_3S$—$Ar$—$S$—$S$—$Ar$—$SO_3X^4$ with $R^{41}$ as defined above and Ar is Aryl.

Particularly preferred accelerating agents are:
SPS: bis-(3-sulfopropyl)-disulfide disodium salt
MPS: 3-mercapto-1-propansulfonic acid, sodium salt Other examples of accelerators, used alone or in mixture, include, but are not limited to: MES (2-Mercaptoethanesulfonic acid, sodium salt); DPS(N,N-dimethyldithiocarbamic acid (3-sulfopropylester), sodium salt); UPS (3-[(amino-iminomethyl)-thio]-1-propylsulfonic acid); ZPS (3-(2-ben-zthiazolylthio)-1-propanesulfonic acid, sodium salt); 3-mercapto-propylsulfonicacid-(3-sulfopropyl)ester; methyl-(ω-sulphopropyl)-disulfide, disodium salt; methyl-(ω-sulphopropyl)-trisulfide, disodium salt.

Such accelerators are typically used in an amount of about 0.1 ppm to about 3000 ppm, based on the total weight of the plating bath. Particularly suitable amounts of accelerator useful in the present invention are 1 to 500 ppm, and more particularly 2 to 100 ppm.

Any additional inhibitors may be used in combination with the inhibitor according to the present invention. In particular so called "leveler" class and "suppressor" class inhibitors may be used.

Suppressing agents or suppressors useful in the present invention include, but are not limited to, polymeric materials, particularly those having heteroatom substitution, and more particularly oxygen substitution. It is preferred that the suppressing agent is a polyalkyleneoxide. Suitable suppressing agents include polyethylene glycol copolymers, particularly polyethylene glycol polypropylene glycol copolymers. The arrangement of ethylene oxide and propylene oxide of suitable suppressors may be block, gradient, or random. The polyalkylene glycol may comprise further alkylene oxide building blocks such as butylene oxide. Preferably, the average molecular weight of suitable suppressors exceeds about 2000 g/mol. The starting molecules of suitable polyalkylene glycol may be alkyl alcohols such as methanol, ethanol, propanol, n-butanol and the like, aryl alcohols such as phenols and bisphenols, alkaryl alcohols such as benzyl alcohol, polyol starters such as glycol, glycerin, trimethylol propane, pentaerythritol, sorbitol, carbohydrates such as saccharose, and the like, amines and oligoamines such as alkyl amines, aryl amines such as aniline, triethanol amine, ethylene diamine, and the like, amides, lactams, heterocyclic amines such as imidazol and carboxylic acids. Optionally, polyalkylene glycol suppressors may be functionalized by ionic groups such as sulfate, sulfonate, ammonium, and the like.

Particularly useful suppressing agents in combination with the inhibitors according to the present inventions are:
(a) suppressing agents obtainable by reacting an amine compound comprising at least three active amino functional groups with a mixture of ethylene oxide and at least one compound selected from C3 and C4 alkylene oxides as described in WO 2010/115796.

Preferably the amine compound is selected from diethylene triamine, 3-(2-aminoethyl)aminopropylamine, 3,3'-iminodi(propylamine), N,N-bis(3-aminopropyl)methylamine, bis(3-dimethylaminopropyl)amine, triethylenetetraamine and N,N'-bis(3-aminopropyl)ethylenediamine.
(b) Suppressing agents obtainable by reacting an amine compound comprising active amino functional groups with a mixture of ethylene oxide and at least one compound selected from $C_3$ and $C_4$ alkylene oxides, said suppressing agent having a molecular weight $M_w$ of 6000 g/mol or more, forming an ethylene C3 and/or C4 alkylene random copolymer as described in WO 2010/115756.
(c) Suppressing agent obtainable by reacting an amine compound comprising at least three active amino functional groups with ethylene oxide and at least one compound selected from C3 and C4 alkylene oxides from a mixture or in sequence, said suppressing agent having a molecular weight $M_w$ of 6000 g/mol or more as described in WO 2010/115757.

Preferably the amine compound is selected from ethylene diamine, 1,3-diaminopropane, 1,4-diaminobutane, 1,5-diaminopentane, 1,6-diaminohexane, neopentanediamine, isophoronediamine, 4,9-dioxadecane-1,12-diamine, 4,7,10-trioxyamidecane-1,13-diamine, triethylene glycol diamine, diethylene triamine, (3-(2-aminoethyl)aminopropylamine, 3,3''-iminodi(propylamine), N,N-bis(3-aminopropyl)methylamine, bis(3-dimethylaminopropyl)amine, triethylenetetraamine and N,N'-bis(3-aminopropyl)ethylenediamine.
(d) Suppressing agent selected from compounds of formula S1

(S1)

wherein the $R^{S1}$ radicals are each independently selected from a copolymer of ethylene oxide and at least one further C3 to C4 alkylene oxide, said copolymer being a random copolymer, the $R^{S2}$ radicals are each independently selected from $R^{S1}$ or alkyl, $X^{S1}$ and $Y^{S1}$ are divalent spacer groups independently, and $X^{S1}$ for each repeating unit independently, selected from $O_2$ to $C_6$ alkanediyl and $Z^{S1}$—(O—$Z^{S1}$)$_t$ wherein the $Z^{S1}$ radicals are each independently selected from $C_2$ to $C_6$ alkanediyl, u is an integer equal to or greater than 0, and t is an integer equal to or greater than 1, as described in WO 2010/115717.

Preferably spacer groups $X^{S1}$ and $Y^{S1}$ are independently, and $X^{S1}$ for each repeating unit independently, selected from C2 to C4 alkylene. Most preferably $X^{S1}$ and $Y^{S1}$ are independently, and $X^{S1}$ for each repeating unit independently, selected from ethylene (—$C_2H_4$—) or propylene (—$C_3H_6$—).

Preferably $Z^{S1}$ is selected from C2 to C4 alkylene, most preferably from ethylene or propylene.

Preferably s is an integer from 1 to 10, more preferably from 1 to 5, most preferably from 1 to 3. Preferably t is an integer from 1 to 10, more preferably from 1 to 5, most preferably from 1 to 3.

In another preferred embodiment the C3 to C4 alkylene oxide is selected from propylene oxide (PO). In this case EO/PO copolymer side chains are generated starting from the active amino functional groups.

The content of ethylene oxide in the copolymer of ethylene oxide and the further C3 to C4 alkylene oxide can generally be from about 5% by weight to about 95% by weight, preferably from about 30% by weight to about 70% by weight, particularly preferably between about 35% by weight to about 65% by weight.

The compounds of formula (S1) are prepared by reacting an amine compound with one or more alkylene oxides. Preferably the amine compound is selected from ethylene diamine, 1,3-diaminopropane, 1,4-diaminobutane, 1,5-diaminopentane, 1,6-diaminohexane, neopentanediamine, isophoronediamine, 4,9-dioxadecane-1,12-diamine, 4,7,10-trioxamidecane-1,13-diamine, triethylene glycol diamine, diethylene triamine, (3-(2-aminoethyl)amino)propylamine, 3,3'-iminodi(propylamine), N,N-bis(3-aminopropyl)methyl- amine, bis(3-dimethylaminopropyl)amine, triethylenetetraamine and N,N'-bis(3-aminopropyl)ethylenediamine.

The molecular weight $M_w$ of the suppressing agent of formula S1 may be between about 500 g/mol to about 30000 g/mol. Preferably the molecular weight $M_w$ should be about 6000 g/mol or more, preferably from about 6000 g/mol to about 20000 g/mol, more preferably from about 7000 g/mol to about 19000 g/mol, and most preferably from about 9000 g/mol to about 18000 g/mol. Preferred total amounts of alkylene oxide units in the suppressing agent may be from about 120 to about 360, preferably from about 140 to about 340, most preferably from about 180 to about 300.

Typical total amounts of alkylene oxide units in the suppressing agent may be about 110 ethylene oxide units (EO) and 10 propylene oxide units (PO), about 100 EO and 20 PO, about 90 EO and 30 PO, about 80 EO and 40 PO, about 70 EO and 50 PO, about 60 EO and 60 PO, about 50 EO and 70 PO, about 40 EO and 80 PO, about 30 EO and 90 PO, about 100 EO and 10 butylene oxide (BuO) units, about 90 EO and 20 BO, about 80 EO and 30 BO, about 70 EO and 40 BO, about 60 EO and 50 BO or about 40 EO and 60 BO to about 330 EO and 30 PO units, about 300 EO and 60 PO, about 270 EO and 90 PO, about 240 EO and 120 PO, about 210 EO and 150 PO, about 180 EO and 180 PO, about 150 EO and 210 PO, about 120 EO and 240 PO, about 90 EO and 270 PO, about 300 EO and 30 butylene oxide (BuO) units, about 270 EO and 60 BO, about 240 EO and 90 BO, about 210 EO and 120 BO, about 180 EO and 150 BO, or about 120 EO and 180 BO.

(e) Suppressing agent obtainable by reacting a polyhydric alcohol condensate compound derived from at least one polyalcohol of formula $X^{S2}(OH)_u$ by condensation with at least one alkylene oxide to form a polyhydric alcohol condensate comprising polyoxyalkylene side chains, wherein u is an integer from 3 to 6 and $X^{S2}$ is an u-valent linear or branched aliphatic or cycloaliphatic radical having from 3 to 10 carbon atoms, which may be substituted or unsubstituted, as described in WO 2011/7012462.

Preferred polyalcohol condensates are selected from compounds of formulae (S2a)

(S2b)

(S2c)

wherein $Y^{S2}$ is an u-valent linear or branched aliphatic or cycloaliphatic radical having from 1 to 10 carbon atoms, which may be substituted or unsubstituted, a is an integer from 2 to 50, b may be the same or different for each polymer arm d and is an integer from 1 to 30, c is an integer from 2 to 3, and d is an integer from 1 to 6. Most preferred Polyalcohols are glycerol condensates and/or pentaerythritol condensates.

(f) Suppressing agent obtainable by reacting a polyhydric alcohol comprising at least 5 hydroxyl functional groups with at least one alkylene oxide to form a polyhydric alcohol comprising polyoxyalkylene side chains as described in WO 2011/7012475. Preferred polyalcohols are linear or cyclic monosaccharide alcohols represented by formula (S3a) or (S3b)

$$HOCH_2-(CHOH)_v-CH_2OH \qquad (S3a)$$

$$(CHOH)_w \qquad (S3b)$$

wherein v is an integer from 3 to 8 and w is an integer from 5 to 10. Most preferred monosaccharide alcohols are sorbitol, mannitol, xylitol, ribitol and inositol. Further preferred polyalcohols are monosaccharides of formula (S4a) or (S4b)

$$CHO-(CHOH)_x-CH_2OH \qquad (S4a)$$

$$CH_2OH-(CHOH)_y-CO-(CHOH)_z-CH_2OH \qquad (S4b)$$

wherein x is an integer of 4 to 5, and y, z are integers and y+z is 3 or 4. Most preferred monosaccharide alcohols are selected from the aldoses allose, altrose, galactose, glucose, gulose, idose, mannose, talose, glucoheptose, mannoheptose or the ketoses fructose, psicose, sorbose, tagatose, mannoheptulose, sedoheptulose, taloheptulose, alloheptulose.

These are particularly effective, strong suppressing agents that cope with the seed overhang issue and provide substantially defect free trench filling despite a non-conformal copper seed.

When suppressors are used, they are typically present in an amount in the range of from about 1 to about 10,000 ppm based on the weight of the bath, and preferably from about 5 to about 10,000 ppm.

Suitable levelers include, but are not limited to, one or more of polyalkanolamine and derivatives thereof, polyglycine, poly(allylamine), polyaniline, polyurea, polyacrylamide, poly(melamine-co-formaldehyde), reaction products of amines with epichlorohydrin, reaction products of an amine, epichlorohydrin, and polyalkylene oxide, reaction products of an amine with a polyepoxide, polyvinylpyridine, polyvinylimidazole, polyvinylpyrrolidone, or copolymers thereof, nigrosines, pentamethyl-para-rosaniline hydrohalide, hexamethyl-pararosaniline hydrohalide, or compounds containing a functional group of the formula N—R—S, where R is a substituted alkyl, unsubstituted alkyl, substituted aryl or unsubstituted aryl. Typically, the alkyl groups are (C1-C6) alkyl and preferably (C1-C4)alkyl. In general, the aryl groups include (C6-C20)aryl, preferably (C6-C10)aryl. Such aryl groups may further include heteroatoms, such as sulfur, nitrogen and oxygen. It is preferred that the aryl group is phenyl or napthyl. The compounds containing a functional group of the formula N—R—S are generally known, are generally commercially available and may be used without further purification.

In such compounds containing the N—R—S functional group, the sulfur ("S") and/or the nitrogen ("N") may be attached to such compounds with single or double bonds. When the sulfur is attached to such compounds with a single bond, the sulfur will have another substituent group, such as but not limited to hydrogen, (C1-C12)alkyl, (C2-C12)alkenyl, (C6-C20)aryl, (C1-C12)alkylthio, (C2-C12) alkenylthio, (C6-C20)arylthio and the like. Likewise, the nitrogen will have one or more substituent groups, such as but not limited to hydrogen, (C1-C12)alkyl, (C2-C12)alkenyl, (C7-C10)aryl, and the like. The N—R—S functional group may be acyclic or cyclic. Compounds containing cyclic N—R—S functional groups include those having either the nitrogen or the sulfur or both the nitrogen and the sulfur within the ring system.

In general, the total amount of leveling agents in the electroplating bath is from 0.5 ppm to 10000 ppm based on the total weight of the plating bath. The leveling agents are typically used in a total amount of from about 0.1 ppm to about 1000 ppm based on the total weight of the plating bath and more typically from 1 to 100 ppm, although greater or lesser amounts may be used.

The metal ion source may be any compound capable of releasing metal ions to be deposited in the electroplating bath in sufficient amount, i.e is at least partially soluble in the electroplating bath. It is preferred that the metal ion source is soluble in the plating bath. Suitable metal ion sources are metal salts and include, but are not limited to, metal sulfates, metal halides, metal acetates, metal nitrates, metal fluoroborates, metal alkylsulfonates, metal arylsulfonates, metal sulfamates, metal gluconates and the like. It is preferred that the metal is copper. It is further preferred that the source of metal ions is copper sulfate, copper chloride, copper acetate, copper citrate, copper nitrate, copper fluoroborate, copper methane sulfonate, copper phenyl sulfonate and copper p-toluene sulfonate. Copper sulfate pentahydrate and copper methane sulfonate are particularly preferred. Such metal salts are generally commercially available and may be used without further purification.

Besides metal electroplating the compositions may be used in electroless deposition of metal containing layers. The compositions may particularly used in the deposition of barrier layers containing Ni, Co, Mo, W and/or Re. In this case, besides metal ions, further elements of groups III and V, particularly B and P may be present in the composition for electroless deposition and thus co-deposited with the metals.

The metal ion source may be used in the present invention in any amount that provides sufficient metal ions for electroplating on a substrate. Suitable metal ion metal sources include, but are not limited to, tin salts, copper salts, and the like. When the metal is copper, the copper salt is typically present in an amount in the range of from about 1 to about 300 g/l of plating solution. It will be appreciated mixtures of metal salts may be electroplated according to the present invention. Thus, alloys, such as copper-tin having up to about 2 percent by weight tin, may be advantageously plated according to the present invention. The amounts of each of the metal salts in such mixtures depend upon the particular alloy to be plated and is well known to those skilled in the art.

In general, the present metal electroplating compositions preferably include an electrolyte, i.e. acidic or alkaline electrolyte, one or more sources of metal ions, optionally halide ions, and optionally other additives like accelerators and/or suppressors. Such baths are typically aqueous. The water may be present in a wide range of amounts. Any type of water may be used, such as distilled, deionized or tap.

The electroplating baths of the present invention may be prepared by combining the components in any order. It is preferred that the inorganic components such as metal salts, water, electrolyte and optional halide ion source, are first added to the bath vessel followed by the organic components such as leveling agents, accelerators, suppressors, surfactants and the like.

Typically, the plating baths of the present invention may be used at any temperature from 10 to 65 degrees C. or higher. It is preferred that the temperature of the plating baths is from 10 to 35 degrees C. and more preferably from 15 degrees to 30 degrees C.

Suitable electrolytes include such as, but not limited to, sulfuric acid, acetic acid, fluoroboric acid, alkylsulfonic acids such as methanesulfonic acid, ethanesulfonic acid, propanesulfonic acid and trifluoromethane sulfonic acid, arylsulfonic acids such as phenyl sulfonic acid and toluenesulfonic acid, sulfamic acid, hydrochloric acid, phosphoric acid, tetraalkylammonium hydroxide, preferably tetramethylammonium hydroxide, sodium hydroxide, potassium hydroxide and the like. Acids are typically present in an amount in the range of from about 1 to about 300 g/l. Alkaline electrolytes are typically present in an amount of about 0.1 to about 20 g/l or to yield a pH of 8 to 13 respectively, and more typically to yield a pH of 9 to 12.

Such electrolytes may optionally contain a source of halide ions, such as chloride ions as in copper chloride or hydrochloric acid. A wide range of halide ion concentrations may be used in the present invention such as from about 0 to about 500 ppm. Typically, the halide ion concentration is in the range of from about 10 to about 100 ppm based on the plating bath. It is preferred that the electrolyte is sulfuric acid or methanesulfonic acid, and preferably a mixture of sulfuric acid or methanesulfonic acid and a source of chloride ions. The acids and sources of halide ions useful in the present invention are generally commercially available and may be used without further purification.

A particular advantage of the present invention is that overplating is reduced or substantially eliminated. Such reduced overplating means less time and effort is spent in removing metal, such as copper, during subsequent chemical-mechanical planarization (CMP) processes, particularly in semiconductor manufacture.

Metal, particularly copper, is deposited in apertures according to the present invention without substantially forming voids within the metal deposit. By the term "without substantially forming voids", it is meant that 95% of the plated apertures are void-free. It is preferred that the plated apertures are void-free.

Typically, substrates are electroplated by contacting the substrate with the plating baths of the present invention. The substrate typically functions as the cathode. The plating bath contains an anode, which may be soluble or insoluble. Optionally, cathode and anode may be separated by a membrane. Potential is typically applied to the cathode. Sufficient current density is applied and plating performed for a period of time sufficient to deposit a metal layer, such as a copper layer, having a desired thickness on the substrate. Suitable current densities, include, but are not limited to, the range of 0.1 to 250 mA/cm$^2$. Typically, the current density is in the range of 0.5 to 60 mA/cm$^2$ when used to deposit copper in the manufacture of integrated circuits. The specific current density depends upon the substrate to be plated, the leveling agent selected and the like. Such current density choice is within the abilities of those skilled in the art. The applied current may be a direct current (DC), a pulse current (PC), a pulse reverse current (PRC) or other suitable current.

In general, when the present invention is used to deposit metal on a substrate such as a wafer used in the manufacture of an integrated circuit, the plating baths are agitated during use. Any suitable agitation method may be used with the present invention and such methods are well-known in the art. Suitable agitation methods include, but are not limited to, inert gas or air sparging, work piece agitation, impingement and the like. Such methods are known to those skilled in the art. When the present invention is used to plate an integrated circuit substrate, such as a wafer, the wafer may be rotated such as from 1 to 150 RPM and the plating solution contacts the rotating wafer, such as by pumping or spraying. In the alternative, the wafer need not be rotated where the flow of the plating bath is sufficient to provide the desired metal deposit.

Metal, particularly copper, is deposited in apertures according to the present invention without substantially forming voids within the metal deposit. By the term "without substantially forming voids", it is meant that 95% of the plated apertures are void-free. It is preferred that the plated apertures are void-free.

While the process of the present invention has been generally described with reference to semiconductor manufacture, it will be appreciated that the present invention may be useful in any electrolytic process where an essentially level or planar copper deposit having high reflectivity is desired, and where reduced overplating and metal filled small features that are substantially free of voids are desired. Such processes include printed wiring board manufacture. For example, the present plating baths may be useful for the plating of vias, pads or traces on a printed wiring board, as well as for bump plating on wafers. Other suitable processes include packaging and interconnect manufacture. Accordingly, suitable substrates include lead frames, interconnects, printed wiring boards, and the like.

Plating equipment for plating semiconductor substrates are well known. Plating equipment comprises an electroplating tank which holds Cu electrolyte and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings such as trenches and vias. The wafer substrate is typically coated with a seed layer of Cu or other metal to initiate plating thereon. A Cu seed layer may be applied by chemical vapor deposition (CVD), physical vapor deposition (PVD), or the like. An anode is also preferably circular for wafer plating and is horizontally disposed at the lower part of tank forming a space between the anode and cathode. The anode is typically a soluble anode.

These bath additives are useful in combination with membrane technology being developed by various tool manufacturers. In this system, the anode may be isolated from the organic bath additives by a membrane. The purpose of the separation of the anode and the organic bath additives is to minimize the oxidation of the organic bath additives.

The cathode substrate and anode are electrically connected by wiring and, respectively, to a rectifier (power supply). The cathode substrate for direct or pulse current has a net negative charge so that Cu ions in the solution are reduced at the cathode substrate forming plated Cu metal on the cathode surface. An oxidation reaction takes place at the anode. The cathode and anode may be horizontally or vertically disposed in the tank.

The present invention is useful for depositing a metal layer, particularly a copper layer, on a variety of substrates, particularly those having micrometer-sized apertures. For example, the present invention is particularly suitable for depositing copper on integrated circuit substrates, such as semiconductor devices, with micrometer-sized vias, trenches or other apertures. In one embodiment, semiconductor devices are plated according to the present invention. Such semiconductor devices include, but are not limited to, wafers used in the manufacture of integrated circuits.

While the process of the present invention has been generally described with reference to semiconductor manufacture, it will be appreciated that the present invention may be useful in any electrolytic process where an essentially level or planar copper deposit having high reflectivity is desired. Accordingly, suitable substrates include lead frames, interconnects, printed wiring boards, and the like having comparable feature sizes.

All percent, ppm or comparable values refer to the weight with respect to the total weight of the respective composition except where otherwise indicated. All cited documents are incorporated herein by reference.

The following examples shall further illustrate the present invention without restricting the scope of this invention.

EXAMPLES

The amine number was determined according to DIN 53176 by titration of a solution of the polymer in acetic acid with perchloric acid.

The nitrogen content was determined according to Kjeldahl (Ehrenberger, Friedrich: Quantitative organische Elementaranalyse, p. 336 ff.).

The acid number was determined according to DIN 53402 by titration of a solution of the polymer in water with aqueous sodium hydroxide solution.

The molecular weight (Mw) was determined by size exclusion chromatography with hexafluoroisopropanol as eluent.

Comparative Example 1

Polyaminoamide C1 from Adipic Acid and Diethylene Triamine (Molecular Ratio 18:19)

Diethylenetriamine (381.3 g, 3.695 mol) was introduced into a 2 l apparatus and water (95.3 g) was added resulting in a temperature increase up to 54° C. The solution was heated to 60° C. and adipic acid (511.4 g, 3.500 mol) was added in portions during 5 min. During this time the temperature increased up to 125° C. Then, a constant nitrogen stream was turned on, the temperature was increased to 180° C. within 50 min, and water and traces of diethylenetriamine were destilled off for 3 h at 180° C. The resulting distillate (221 g) showed an amine number of 0.75 mmol/g, indicating a content of 5.7 g diethylenetriamine in the distillate. The heating was turned off and when the temperature reached 158° C., water (892 g) was added slowly. The resulting polyaminoamide was obtained as an aqueous solution (1643 g) showing an amine number of 2.80 mmol/g, an acid number of 0.30 mmol/g and a water content of 54% by weight. Gel permeation chromatography revealed an average molecular weight of Mw=24500 g/mol and a polydispersity of Mw/Mn=2.3. For storage, the polyaminoamide solution was diluted by additional water resulting in a final water content of 80% by weight.

Comparative Example 2

Polyaminoamide C2 from adipic acid and N,N'-bis-(3-aminopropyl)-ethylenediamine (molecular ratio 18:19)

N,N'-bis-(3-aminopropyl)-ethylenediamine (87.1 g, 0.500 mol) was placed into a 250 ml apparatus and water (21.8 g) was added resulting in a temperature increase up to 64° C. Then, adipic acid (62.9 g, 0.47 mol) was added in portions during 5 min. During this time the temperature increased up to 85° C. Then, a constant nitrogen stream was turned on, the temperature was increased to 180° C. within 40 min, and water and traces of N,N'-bis-(3-aminopropyl)-ethylenediamine were destilled off for 4 h at 180° C. The resulting distillate (38 g) showed an amine number of 0.40 mmol/g, indicating a content of 0.66 g N,N'-bis-(3-aminopropyl)-ethylenediamine in the distillate. The heating was turned off and when the temperature reached 160° C., water (92.9 g) was added slowly. The solution was filled into a 1 l round bottomed flask, followed by the addition of another water portion (465 g). Polyaminoamide C2 (692 g) was obtained as an aqueous solution showing an amine number of 1.64 mmol/g, an acid number of 0.15 mmol/g and a water content of 80% by weight. Gel permeation chromatography revealed an average molecular weight of Mw=37700 g/mol and a polydispersity of Mw/Mn=2.5.

Example 3

Functionalized Polyaminoamide 1 from Polyaminoamide C1 and Benzyl Chloride

Polyaminoamide C1 (358 g), water (297 g) and benzyl chloride (84.9 g, 670 mmol) were placed into a 1 l apparatus and stirred at 80° C. for 6 h. One part of the resulting liquid (50 g) was washed by dichloromethane (3×20 ml) to remove unreacted benzyl chloride and the side product benzyl alcohol. Then, volatile compounds were removed at 80° C. in vacuo to give leveler 1 as a light rose solid (7.70 g) showing a nitrogen content of 12.5 g N/100 g.

Example 4

Functionalized Polyaminoamide 2 from Polyaminoamide C1 and Styrene Oxide

Polyaminoamide C1 (200 g) and water (408 g) were placed into a 1 l apparatus and heated to 100° C. during 30 min. Then, styrene oxide (11.5 g) was added dropwise during 8 min. The reaction mixture was stirred at 100° C. for 4 h, cooled to room temperature and the solvent was removed in vacuo at 80° C. Polyaminoamide 2 was obtained as a beige solid (63.5 g). Gel permeation chromatography revealed an average molecular weight of Mw=27600 g/mol and a polydispersity of Mw/Mn=1.8.

Example 5

Functionalized Polyaminoamide 3 from Adipic Acid and Diethylene Triamine (Molecular Ratio 18:19), PO and Benzyl Chloride Diethylenetriamine (820 g, 7.95 mol) was introduced into a 4 l apparatus and water (205 g) was added resulting in a temperature increase up to 54° C. The solution was heated to 60° C. and adipic acid (1100 g, 7.53 mol) was added in portions during 8 min. During this time the temperature increased up to 127° C. Then, a constant nitrogen stream was turned on, the temperature was increased to 180° C. within 30 min, and water and traces of diethylenetriamine were destilled off for 3 h at 180° C. The resulting distillate (488 g) showed an amine number of 0.48 mmol/g, indicating a content of 8.0 g diethylenetriamine in the distillate. The heating was turned off and when the temperature reached 161° C., water (1918 g) was added slowly. The reaction product was filled into a 10l Erlenmeyer flask, followed by the addition of another water portion (4800 g). The resulting polyaminoamide intermediate product was obtained as an aqueous solution (8160 g) showing an amine number of 1.42 mmol/g, an acid number of 0.06 mmol/g and a water content of 80% by weight. Gel permeation chromatography revealed an average molecular weight of Mw=26600 g/mol and a polydispersity of Mw/Mn=2.3.

The polyaminoamide intermediate (1450 g) was placed into 2l autoclave and heated to 110° C. under nitrogen. At an initial pressure of 5.2 bar, propylene oxide (23.9 g, 0.412 mol) was added in portions during 10 min and a maximum pressure of 6.8 bar was reached. The reaction mixture was allowed to post-react for 6 h. Then, the autoclave was cooled to 30° C. The PO-functionalized polyaminoamide intermediate product was obtained as a clear aqueous solution (1469 g) with an amine number of 1.1 mmol/g.

The PO-functionalized polyaminoamide (400 g), water (343.6 g) and benzyl chloride (94.4 g, 0.749 mol) were placed into a 1 l apparatus. The reaction mixture was stirred at 80° C. for 6 h resulting in a yellow emulsion. The organic phase (33 g) was removed in a separation funnel to give polyaminoamide 3 as a yellow aqueous solution (799 g) having a nitrogen content of 1.91 g N/100 g.

Example 6

Functionalized Polyaminoamide 4 from Polyaminoamide C2 and 1-Chloromethylnaphthalene Polyaminoamide C2 (200 g) and water (318 g) were placed into a 1 l apparatus and heated to 80° C. 1-chloromethylnaphthalene (90% purity, Aldrich; 8.7 g, 0.049 mol) was added dropwise during 20 min. The reaction mixture was stirred at 80° C. for further 7 h, cooled to room temperature and the volatile compounds were removed in vacuo at 60-80° C. to obtain a solid. The solid was again dissolved in 99 weight equivalents water and the pH was adjusted to 5 by concentrated sulfuric acid to give polyaminoamide 4 as an aqueous solution with a water content of 99% by weight.

Example 7

Functionalized Polyaminoamide 5 from Adipic Acid and Dipropylene Triamine (Molecular Ratio 18:19) and 1-Chloromethylnaphthalene Dipropylenetriamine (65.6 g, 0.500 mol) was introduced into a 250 ml apparatus and water (16.4 g) was added resulting in a temperature increase up to 44° C. The solution was heated to 74° C. and adipic acid (62.9 g, 0.470 mol) was added in portions 3 min. During this time the temperature increased up to 94° C. Then, a constant nitrogen stream was turned on, the temperature was increased to 120° C. and the reaction mixture was stirred at this temperature for 1 h. Then, it was further heated to 180° C. within 1 h, and water and traces of dipropylenetriamine were destilled off for 3.5 h at 180° C. The resulting distillate (36 g) showed an amine number of 2.37 mmol/g, indicating a content of 3.7 g dipropylenetriamine in the distillate. The heating was turned off and when the temperature reached 160° C., water (118 g) was added slowly. The resulting solution was filled into a 1 l round bottomed flask and additional water (354 g) was added to give the intermediate polyaminoamide product (579 g) showing an amine number of 1.0 mmol/g, an acid number of 0.1 mmol/g and a water content of 80% by weight.

The polyaminoamide intermediate (203 g) was placed into a 1 l apparatus and heated to 80° C. 1-chloromethylnaphthalene (90% purity, Aldrich; 5.9 g, 0.030 mol) was added dropwise during 35 min. The reaction mixture was stirred at 80° C. for further 6 h, cooled to room temperature and the volatile compounds were removed in vacuo at 60-80° C. to obtain a solid. The solid was again dissolved in 99 weight equivalents water and the pH was adjusted to 5 by concentrated sulfuric acid to give polyaminoamide 5 as an aqueous solution with a water content of 99% by weight.

Example 8

Labor: L1973

Polyamidoamine 6 from Piperazine,
Xylylenediamine and Methylene Bisacrylamide
(Molecular Ratio 16,2:9,5:18)

A 500 ml apparatus flushed with nitrogen was charged with methylene bisacrylamide (50.0 g, 324 mmol), water (150 g) and butylated hydroxyanisole (150 mg, 0.8 mol). The resulting mixture was stirred vigorously (900 rpm). The reaction flask was protected from light by wrapping the apparatus with aluminum foil. The mixture was cooled to 0° C. and piperazine (25.1 g, 291 mmol) and xylylenediamine (23.3 g, 171 mmol) were added in portions during 30 min. After the complete addition of piperazine and xylylenediamine the resulting mixture was stirred additional 60 min at 0° C. Then, the cooling bath was removed and the reaction mixture was stirred at ambient temperature for 48 h at 500 rpm. The crude reaction mixture was concentrated under reduced pressure to give the title compound as light pink solid.

The resulting polyamidoamine showed an amine number of 2.95 mmol/g. Gel permeation chromatography revealed an average molecular weight of Mw=37400 and a polydispersity of Mw/Mn=1.7.

Comparative Example 9

A copper plating bath was prepared by combining 60 g/l copper as copper sulfate, 10 g/l sulfuric acid, 0.150 g/l chloride ion as HCl, 0.100 g/l of an EO/PO copolymer suppressor, and 0.028 g/l of SPS and DI water. The EO/PO copolymer suppressor had a molecular weight of <5000 g/mole and terminal hydroxy groups. Additionally, 2 ml/l of a 1% by weight solution of polyaminoamide C1 as prepared in comparative example 1 was added.

Prior electroplating the substrate possessing holes with a diameter of about 5 micrometers and a depth of about 55 micrometers was immersed in DI-Water including an ultrasonic process for 5 min for complete wetting of the vias.

After wetting the substrate was immersed in the above described plating bath and a waiting period of 30 s was applied. After this period copper was electroplated onto the wafer substrate by contacting the substrate at 25 degrees C. applying a direct current of −1 mA/cm$^2$ for 30 min. The thus electroplated copper was investigated by optical microscopy after manual polishing of the substrate.

Figure 1:
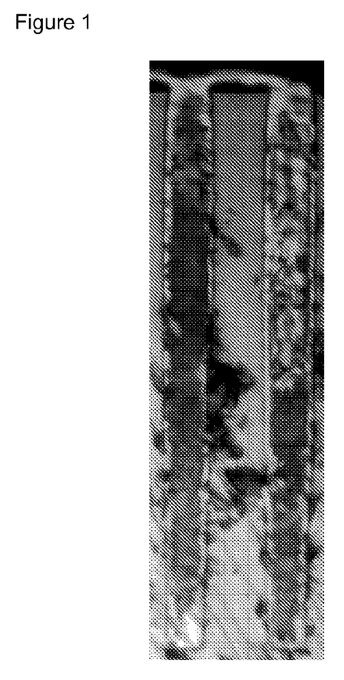
FIG. 1 shows a via of having a diameter of about 5 micrometers and a depth of about 55 micrometers after the copper deposition according to comparative example 9 showing void formation within the via.

The result shows a copper deposition which fails in a bottom-up plating characteristic. This can be clearly seen from FIG. 1 by the void formation within the via.

Comparative Example 10

A copper plating bath was prepared by combining 60 g/l copper as copper sulfate, 10 g/l sulfuric acid, 0.150 g/l chloride ion as HCl, 0.100 g/l of an EO/PO copolymer suppressor, and 0.028 g/l of SPS and DI water. The EO/PO copolymer suppressor had a molecular weight of <5000 g/mole and terminal hydroxy groups. Additionally, 2 ml/l of a 1% by weight solution of polyaminoamide C2 as prepared in comparative example 2 was added.

Prior electroplating the substrate possessing holes with a diameter of about 5 micrometers and a depth of about 55 micrometers was immersed in DI-Water including an ultrasonic process for 5 min for complete wetting of the vias.

After wetting the substrate was immersed in the above described plating bath and a waiting period of 30 s was applied. After this period copper was electroplated onto the wafer substrate by contacting the substrate at 25 degrees C. applying a direct current of −1 mA/cm$^2$ for 30 min. The thus electroplated copper was investigated by optical microscopy after manual polishing of the substrate.

Figure 2:
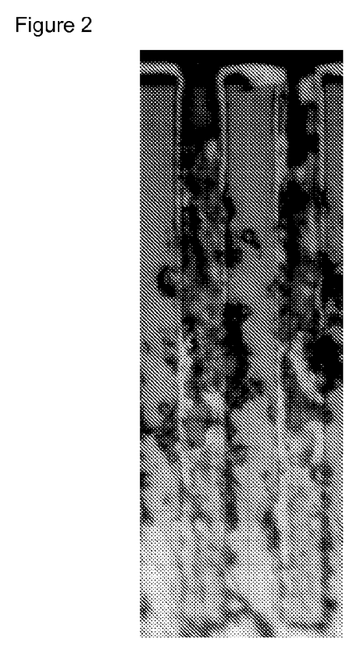
FIG. 2 shows a via of having a diameter of about 5 micrometers and a depth of about 55 micrometers after the copper deposition according to comparative example 10 showing void formation within the via.

The result shows a copper deposition which fails in a bottom-up plating characteristic. This can be clearly seen from FIG. 2 by the void formation within the via.

Example 11

A copper plating bath was prepared by combining 60 g/l copper as copper sulfate, 10 g/l sulfuric acid, 0.150 g/l chloride ion as HCl, 0.100 g/l of an EO/PO copolymer suppressor, and 0.028 g/l of SPS and DI water. The EO/PO copolymer suppressor had a molecular weight of <5000 g/mole and terminal hydroxy groups. Additionally, 6 ml/l of a 0.26% by weight solution of polyaminoamide 1 as prepared in example 3 was added.

Prior electroplating the substrate possessing holes with a diameter of about 5 micrometers and a depth of about 55 micrometers was immersed in the above described for a period of 300 s. After this period copper was electroplated onto the wafer substrate by contacting the substrate at 25 degrees C. applying a direct current of −1 mA/cm$^2$ for 30 min. The thus electroplated copper was investigated by FIB/SEM (Focused Ion Beam/Scanning Electron Microscopy).

Figure 3:
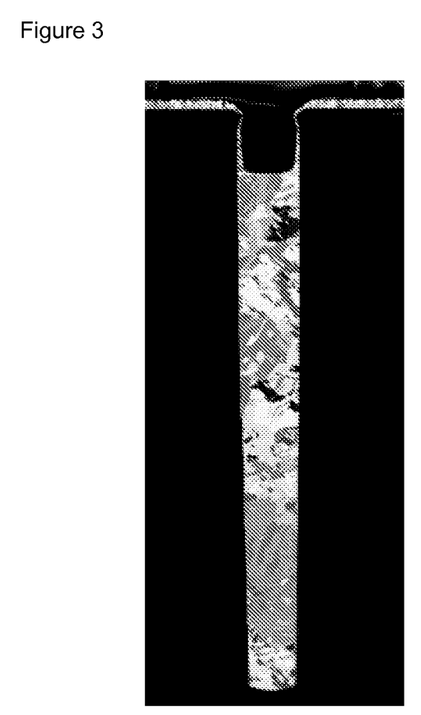
FIG. 3 shows a via of having a diameter of about 5 micrometers and a depth of about 55 micrometers after the copper deposition according to example 11 showing a typical bottom-up plating characteristic without forming any voids.

The result (see FIG. 3) shows a copper deposition preferentially within the via with a typical bottom-up plating characteristic without forming any voids.

Example 12

A copper plating bath was prepared by combining 60 g/l copper as copper sulfate, 10 g/l sulfuric acid, 0.150 g/l chloride ion as HCl, 0.100 g/l of an EO/PO copolymer suppressor, and 0.028 g/l of SPS and DI water. The EO/PO copolymer suppressor had a molecular weight of <5000 g/mole and terminal hydroxy groups. Additionally, 6 ml/l of a 0.33% by weight solution of polyaminoamide 2 as prepared in example 4 was added.

Prior electroplating the substrate possessing holes with a diameter of about 5 micrometers and a depth of about 55 μm was immersed in the above described for a period of 300 s. After this period copper was electroplated onto the wafer substrate by contacting the substrate at 25 degrees C. applying a direct current of −1 mA/cm$^2$ for 30 min. The thus electroplated copper was investigated by optical microscopy after manual polishing of the substrate.

Figure 4:
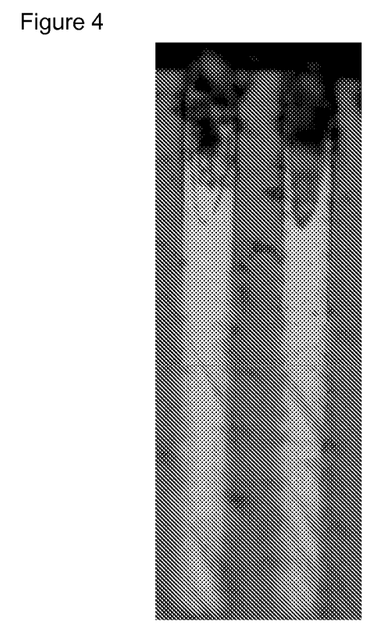
FIG. 4 shows a via of having a diameter of about 5 micrometers and a depth of about 55 micrometers after the copper deposition according to example 12 showing a typical bottom-up plating characteristic without forming any voids.

The result (see FIG. 4) shows a copper deposition preferentially within the via with a typical bottom-up plating characteristic without forming any voids.

Example 13

A copper plating bath was prepared by combining 40 g/l copper as copper sulfate, 10 g/l sulfuric acid, 0.050 g/l chloride ion as HCl, 0.100 g/l of an EO/PO copolymer suppressor, and 0.028 g/l of SPS and DI water. The EO/PO copolymer suppressor had a molecular weight of <5000 g/mole and terminal hydroxy groups. Additionally, 1.5 ml/l of 1% by weight solution of polyaminoamide 3 as prepared in example 5 was added.

Prior electroplating the substrate possessing holes with a diameter of about 5 micrometers and a depth of about 40 micrometers was immersed in DI-Water including an ultrasonic process for 5 min for complete wetting of the vias.

After wetting, the substrate was immersed in the above described plating bath and a waiting period of 30 s was applied. After this period, copper was electroplated onto the wafer substrate by contacting the substrate at 25 degrees C. applying a direct current of $-1.5$ mA/cm$^2$ for 30 min. The thus electroplated copper was investigated by optical microscopy after manual polishing of the substrate.

Figure 5:
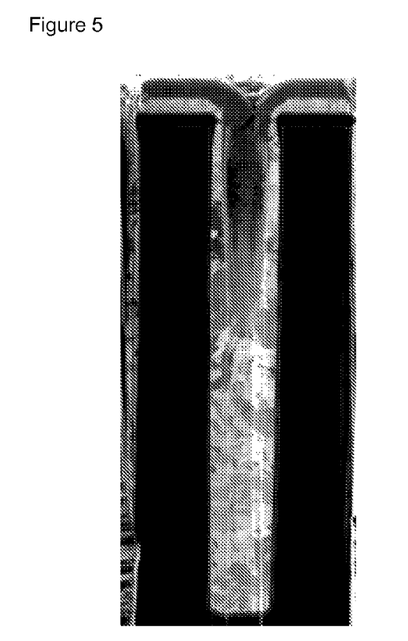
FIG. 5 shows a via of having a diameter of about 5 micrometers and a depth of about 40 micrometers after the copper deposition according to example 13 showing a typical bottom-up plating characteristic without forming any voids.

The result (see FIG. 5) shows a copper deposition preferentially within the via with a typical bottom-up plating characteristic without forming any voids.

Example 14

A copper plating bath was prepared by combining 60 g/l copper as copper sulfate, 10 g/l sulfuric acid, 0.050 g/l chloride ion as HCl, 0.100 g/l of an EO/PO copolymer suppressor, and 0.028 g/l of SPS and DI water. The EO/PO copolymer suppressor had a molecular weight of <5000 g/mole and terminal hydroxy groups. Additionally, 2 ml/l of 1% by weight solution of polyaminoamide 4 as prepared in example 6 was added.

Prior electroplating the substrate possessing holes with a diameter of about 5 micrometers and a depth of about 50 micrometers was immersed in DI-Water including an ultrasonic process for 5 min for complete wetting of the vias.

After wetting, the substrate was immersed in the above described plating bath and a waiting period of 30 s was applied. After this period, copper was electroplated onto the wafer substrate by contacting the substrate at 25 degrees C. applying a direct current of $-1$ mA/cm$^2$ for 30 min. The thus electroplated copper was investigated by optical microscopy after manual polishing of the substrate.

Figure 6:
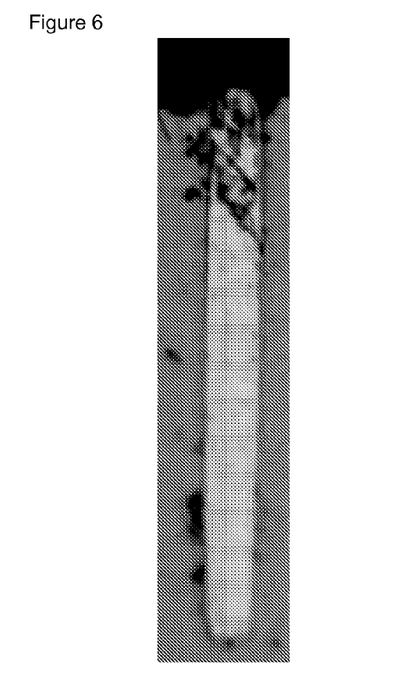
FIG. 6 shows a via of having a diameter of about 5 micrometers and a depth of about 50 micrometers after the copper deposition according to example 14 showing a typical bottom-up plating characteristic without forming any voids.

The result (see FIG. 6) shows a copper deposition preferentially within the via with a typical bottom-up plating characteristic without forming any voids.

Example 15

A copper plating bath was prepared by combining 60 g/l copper as copper sulfate, 10 g/l sulfuric acid, 0.050 g/l chloride ion as HCl, 0.100 g/l of an EO/PO copolymer suppressor, and 0.028 g/l of SPS and DI water. The EO/PO copolymer suppressor had a molecular weight of <5000 g/mole and terminal hydroxy groups. Additionally, 2 ml/l of 1% by weight solution of polyaminoamide 5 as prepared in example 7 was added.

Prior electroplating the substrate possessing holes with a diameter of about 5 micrometers and a depth of about 50 micrometers was immersed in DI-Water including an ultrasonic process for 5 min for complete wetting of the vias.

After wetting, the substrate was immersed in the above described plating bath and a waiting period of 30 s was applied. After this period, copper was electroplated onto the wafer substrate by contacting the substrate at 25 degrees C. applying a direct current of $-1$ mA/cm$^2$ for 30 min. The thus electroplated copper was investigated by optical microscopy after manual polishing of the substrate.

Figure 7:
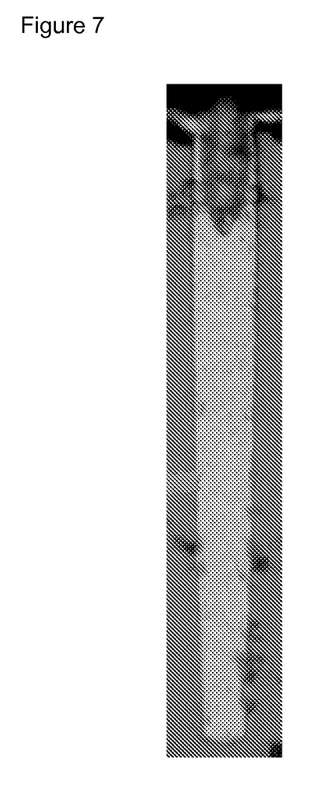
FIG. 7 shows a via of having a diameter of about 5 micrometers and a depth of about 50 micrometers after the copper deposition according to example 15 showing a typical bottom-up plating characteristic without forming any voids.

The result (see FIG. 7) shows a copper deposition preferentially within the via with a typical bottom-up plating characteristic without forming any voids.

The invention claimed is:

1. A composition comprising a source of metal ions and a polyaminoamide, wherein the polyaminoamide comprises a structural unit represented by formula I

[A]$_p$[B]$_q$[D]$_r$. (I)

or a derivative thereof obtained by complete or partial protonation, N-functionalization, or N-quaternization, wherein

A is a diradical represented by formula Ia

B is a chemical bond or a diradical represented by formula Ib

D is a chemical bond or a divalent group represented by formula Ic (Ic)

$D^1$ is, for each repeating unit 1 to p independently, a chemical bond or a divalent group that is a saturated or unsaturated $C_1$ to $C_{20}$ organic radical, $D^2$, $D^3$ are independently straight chain or branched $C_1$ to $C_{10}$ alkanediyl, optionally substituted by N or O, $D^4$ is a straight chain or branched $C_2$ to $C_6$ alkanediyl, a $C_6$ to $C_{10}$ aryl or heteroaryl diradical, or $C_8$ to $C_{20}$ arylalkanediyl, $C_8$ to $C_{20}$ heteroarylalkanediyl $D^5$ is a straight chain or branched $C_1$- to $C_7$-alkanediyl, optionally substituted by a heteroatom, $R^1$ is, for each repeating unit 1 to n independently, H, $C_1$-$C_{20}$-alkyl, $C_5$-$C_{20}$-aryl or $C_5$-$C_{20}$-heteroaryl, optionally substituted by hydroxyl, alkoxy or alkoxycarbonyl, n is an integer from 2 to 250, p is an integer from 2 to 150, q is an integer from 0 to 150, r is an integer from 0 to 150, and wherein either (i) at least one of $D^4$ or $R^1$ comprises a $C_5$ to $C_{20}$ aromatic moiety or (ii) the polyaminoamide is functionalized, quaternized, or both functionalized and quaternized with a $C_5$ to $C_{20}$ aromatic moiety.

2. The composition according to claim 1 wherein the polyaminoamide is represented by formula II (II)

wherein $E^1$, $E^2$ are each independently
 (a) a nucleophilically displaceable leaving group,
 (b) NH—($C_1$-$C_{20}$-alkyl) or NH—($C_1$-$C_{20}$-alkenyl) or NH-aryl,
 (c) H—{NH-[$D^2$-$NR^1$]$_n$-$D^3$-NH},
 (d) ($C_1$-$C_{20}$-alkyl)-CO—{NH-[$D^2$-$NR^2$]$_n$-$D^3$-NH},
 (e) ($C_1$-$C_{20}$-alkenyl)-CO—{NH-[$D^2$-$NR^2$]$_n$-$D^3$-NH}, or
 (f) ($C_1$-$C_{20}$-aryl)-CO—{NH-[$D^2$-$NR^2$]$_n$-$D^3$-NH},
and wherein $R^1$ comprises a $C_5$ to $C_{20}$ aromatic moiety.

3. The composition according to claim 1, wherein $D^1$ is a $C_1$-$C_{20}$ alkanediyl group.

4. The composition according to claim 1, wherein $D^2$ and $D^3$ are each independently $(CH_2)_2$ or $(CH_2)_3$.

5. The composition according to claim 1, wherein $R^1$ is hydrogen or methyl.

6. The composition according to claim 1, wherein $R^1$ is a $C_5$ to $C_{20}$ aryl, a $C_5$ to $C_{20}$ heteroaryl, a $C_5$ to $C_{20}$ arylalkyl, or a $C_5$ to $C_{20}$ heteroarylalkyl.

7. The composition according to claim 1, wherein the polyaminoamide is obtained by reacting at least one polyalkylenepolyamine with at least one dicarboxylic acid.

8. The composition according to claim 7, wherein the polyalkylenepolyamine is at least one member selected from the group consisting of diethylenetriamine, triethylenetramine, tetraethylenepentamine, pentaethylenehexamine, diaminopropylethylenediamine, ethylenepropylenetriamine, 3-(2-aminoethyl)aminopropylamine, dipropylenetriamine, a polyethyleneimine, $H_2N$—$(CH_2)_2$—O—$(CH_2)_2$—$NH_2$ and $H_2N$—$(CH_2)_2$—O—$(CH_2)_2$—O—$(CH_2)_2$—$NH_2$.

9. The composition according to claim 7, wherein the dicarboxylic acid is at least one member selected from group consisting of oxalic acid, malonic acid, succinic acid, tartaric acid, maleic acid, itaconic acid, glutaric acid, adipic acid, suberic acid, sebacic acid, iminodiacetic acid, aspartic acid, and glutamic acid.

10. A composition comprising a source of metal ions and a polyaminoamide, wherein the polyaminoamide comprises an amide and an amine functional group in its polymeric backbone and wherein at least one aromatic moiety is attached to or located within the polymeric backbone, wherein the polyaminoamide comprises a group represented by formula III (III)

or a derivative of a polyaminoamide of formula III obtained by complete or partial protonation, N-functionalization, or N-quaternization wherein $D^6$ is, for each repeating unit 1 to s independently, a divalent group that is a saturated, unsaturated or aromatic $C_1$-$C_{20}$ organic radical,

$D^7$ is a straight chain or branched $C_2$-$C_6$ alkanediyl, $C_6$-$C_{10}$ aryldiradical, or $C_8$-$C_{20}$ arylalkanediyl, $R^2$ is, for each repeating unit 1 to s independently, H, $C_1$-$C_{20}$ alkyl, $C_1$-$C_{20}$ alkenyl, optionally substituted by hydroxyl, alkoxy or alkoxycarbonyl, or aryl, and wherein two $R^2$ may together form a ring system, and s is an integer from 1 to 250, and wherein either (i) at least one of $D^6$, $D^7$ or $R^2$ comprises a $C_5$-$C_{20}$ aromatic moiety or (ii) the polyaminoamide is functionalized, quaternized, or both functionalized and quaternized with a $C_5$-$C_{20}$ aromatic moiety.

11. The composition according to claim 10 being represented by formula IV (IV)

wherein

E³, E⁴ are each independently
- (a) NH—$C_1$-$C_{20}$-alkyl or NH—$C_1$-$C_{20}$-alkenyl or NH-aryl,
- (b) N—($C_1$-$C_{20}$-alkyl)$_2$ or N—($C_1$-$C_{20}$-alkenyl)$_2$ or N-(aryl)$_2$ or N—($C_1$-$C_{20}$-alkyl)($C_1$-$C_{20}$-alkenyl) or N—($C_1$-$C_{20}$-alkyl)(aryl) or N—($C_1$-$C_{20}$-alkenyl)(aryl),
- (c) $NR^2$-$D^7$-$NR^2H$, or
- (d) $NR^2$-$D^7$-$NR^2$—$CH_2$—$CH_2$—CO—NH—($C_1$-$C_{20}$-alkyl) or $NR^2$-$D^7$-$NR^2$—$CH_2$—$CH_2$—CO—NH—($C_1$-$C_{20}$-alkenyl) or $NR^2$-$D^7$-$NR^2$—$CH_2$—$CH_2$—CO—NH-aryl, and wherein at least one of $D^6$ or $R^2$ comprises a $C_5$ to $C_{20}$ aromatic moiety.

12. The composition according to claim 1, wherein the metal ions comprise a copper ion.

13. The composition according to claim 1, further comprising an accelerating agent.

14. The composition according to claim 1, further comprising a suppressing agent.

15. A bath comprising the composition of claim 1, wherein the bath is suitable for depositing a metal containing layer.

16. A process for depositing a metal layer on a substrate, the process comprising
- a) contacting a metal plating bath comprising the composition according to claim 1 with the substrate, and
- b) applying a current density to the substrate for a time sufficient to deposit a metal layer onto the substrate.

17. The composition according to claim 1, wherein B is a diradical represented by formula Ib, and $D^4$ comprises a $C_5$ to $C_{20}$ aromatic moiety.

18. The composition according to claim 17, wherein $D^4$ is a $C_6$ to $C_{10}$ aryl or heteroaryl diradical.

19. The composition according to claim 1, wherein the polyaminoamide is functionalized, quaternized, or both functionalized and quaternized with a $C_5$ to $C_{20}$ aromatic moiety.

20. The composition according to claim 1, wherein $R^1$ comprises a $C_5$ to $C_{20}$ aromatic moiety.

* * * * *